United States Patent
Sousa (10) Patent No.: US 6,522,187 B1
(45) Date of Patent: Feb. 18, 2003

(54) CMOS SWITCH WITH LINEARIZED GATE CAPACITANCE

(75) Inventor: Joseph L. Sousa, Lawrence, MA (US)

(73) Assignee: Linear Technology Corporation, Milpitas, CA (US)

(*) Notice: Subject to any disclaimer, the term of this patent is extended or adjusted under 35 U.S.C. 154(b) by 0 days.

(21) Appl. No.: 09/804,348

(22) Filed: Mar. 12, 2001

(51) Int. Cl.[7] .................. H03K 17/16; H03K 17/687
(52) U.S. Cl. ........................... 327/391; 327/437
(58) Field of Search ............................. 327/378, 382, 327/381, 437, 408, 391

(56) References Cited

U.S. PATENT DOCUMENTS 4,651,037 A * 3/1987 Ogasawara et al. ......... 327/389
4,988,902 A * 1/1991 Dingwall .................... 327/382
5,153,454 A * 10/1992 Kohdaka .................... 327/69
5,646,558 A * 7/1997 Jamshidi .................... 327/408

* cited by examiner

Primary Examiner—Timothy P. Callahan
Assistant Examiner—Terry L. Englund
(74) Attorney, Agent, or Firm—Fish & Neave; Joel Weiss; George L. Kanabe (57) ABSTRACT

A CMOS switch with compensation circuitry that maintains linearized gate capacitance, said switch capable of selectively processing a signal independent of changes to gate capacitance current. The switch passes signals which are substantially insensitive to changes in source impedance. Thus, the switch processes an analog signal with a minimum of distortion as a result of gate capacitance currents.

21 Claims, 6 Drawing Sheets

PRIOR ART

CMOS SWITCH WITH LINEARIZED GATE CAPACITANCE

BACKGROUND OF THE INVENTION

The present invention relates to analog switches. More particularly, the present invention relates to linearizing response of analog switches.

Possible implementations of an analog switch may be to selectively transmit analog signals at the input of a sample and hold circuit or at the inputs of a multiplexer. In those circuits, noise generated by the analog switch can degrade the transmission analog signal. A significant source of noise in a circuit that includes a particular category of analog switches known as CMOS transmission gates is the distortion that occurs because of the switching gate capacitance currents at the switching thresholds of the switches. The characteristics of this noise is unpredictable because, at the switching thresholds, gate capacitance currents provide different noise results with different source impedances. For example, in an exemplary conventional circuit with an analog CMOS switch, this distortion is −69.5 dB with 50Ω source impedance and −96 dB with 0Ω source impedance. This variation of noise results for different source impedances reduces the predictability of distortion caused by the analog switch, increases the sensitivity of the switch to different source impedances and, generally, degrades the signal processing capability of the switch.

It would be desirable to provide an analog switch that processes a signal without changing gate-to-channel capacitance of the switch.

It would also be desirable to provide an analog switch that is substantially insensitive to changes in source impedance.

SUMMARY OF THE INVENTION

It is an object of the invention to provide an analog switch that processes a signal without changing the gate-to-channel capacitance of the switch.

It is also an object of this invention to provide an analog switch that is substantially insensitive to changes in source impedance.

A compensation circuit for compensating non-linear gate capacitance current in a CMOS switch is provided.

A method for maintaining a substantially constant gate capacitance of a CMOS switch with respect to a channel voltage—i.e., the voltage that is being transmitted by the switch—source resistance is provided. In this method, the CMOS switch includes an N-channel device and a P-channel device. The method includes compensating a non-linear gate capacitance current in the N-channel device at a first threshold level of an input voltage and compensating a non-linear gate capacitance current in the P-channel device at a second threshold level of input voltage.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

This invention relates to reducing the nonlinear distortion caused by gate capacitance currents in a CMOS analog switch.

In conventional CMOS analog switches, a P-channel device is coupled to an N-channel device to form a "transmission gate" for an analog input signal.

The analog signal may be a varying signal, e.g., a sine wave. When the input signal is a sine wave, the CMOS switch may conduct the signal differently in three different signal ranges. In a first, relatively extreme, range of the analog signal, only the N-channel portion of the CMOS switch conducts. In a second, relatively extreme, range of the analog signal, only the P-channel conducts. Finally, in a middle range, both the N-channel and the P-channel conduct.

In the middle range, as one device conducts more heavily, conduction in the other is reduced. This relationship between the N-channel device and the P-channel device maintains the total ON-resistance of the CMOS switch at an approximately constant level.

However, though the ON-resistance of the CMOS switch is maintained at an approximately constant level, the signal is distorted in a non-linear fashion at the signal levels that represent switching thresholds for the P-channel device and the N-channel device. This non-linear distortion of the signal is caused by the gate capacitance currents. Every MOSFET, including the N-channel and P-channel devices in the CMOS switch according to the invention, requires charging and discharging the internal gate-channel capacitance (the gate electrode forms a parallel-plate capacitor with the channel, with the oxide layer serving as the capacitor dielectric) of the respective devices. This charge leads to the distortion of the analog signal at the switching thresholds of the N-channel device and the P-channel device. This distortion is caused by a non-linear dependance of the capacitance on the channel voltage.

A circuit according to the invention compensates for distortion caused by the gate-channel capacitances of the N-channel device and the P-channel device at the switching thresholds. The architecture of one embodiment of a compensation circuit according to the invention is as follows. A circuit according to the invention utilizes two drain-source connected CMOS transistors and preferably couples one of them by its drain-source connected node to the drain of the CMOS switch and the other one by its drain-source connected node to the source of the CMOS switch. Furthermore, the two source-drain connected switches are each preferably half the size of the CMOS switch and each preferably has opposite channel polarity to the CMOS switch.

The compensation circuit operates in the following way. When the analog signal approaches the switching level of the P-channel of the CMOS, it simultaneously approaches the N-channel switching levels of the two drain-source connected switches. Therefore, the gate capacitance current present in the P-channel of the CMOS switch is counterbalanced by the gate capacitance current in the N-channel of each of the preferably half-size drain-source connected transistors. This substantially reduces the distortion caused by the gate capacitance current of the P-channel in the CMOS switch at the switching threshold as seen by the source impedance. Furthermore, this compensation circuit architecture does not increase the ON-resistance of the switch since each of the smaller switches are drain-source connected. Therefore, the only contribution of these switches is the smoothing of the gate capacitance current of the P-channel of the CMOS switch by the gate capacitance current of the two smaller drain-source connected N-channel devices. The compensation circuit provides similar linearization of the gate capacitance of the N-channel by turning ON the smaller P-channel devices substantially in opposition to the N-channel of the CMOS switch.

An additional contribution of these switches is to provide an increased diffusion-capacitance. This increased diffusion capacitance can be used to balance the diffusion capacitance between the P-channel device and N-channel device of the main switch such that their respective diffusion capacitances are substantially equal.

One way to balance the gate capacitance is as follows. First, as described below in more detail, the P-channel device in the main switch and the N-channel device in the main switch are set to a preferred ratio—e.g., the P-channel device is 4 to 1 with the N-channel device. Then, the smaller devices are set to an opposite ratio than the main devices— e.g., the smaller P-channel devices are at a 1 to 4 ratio with the main N-channel device. In this way, the gate capacitance of the entire circuit is substantially balanced.

Figure 1:
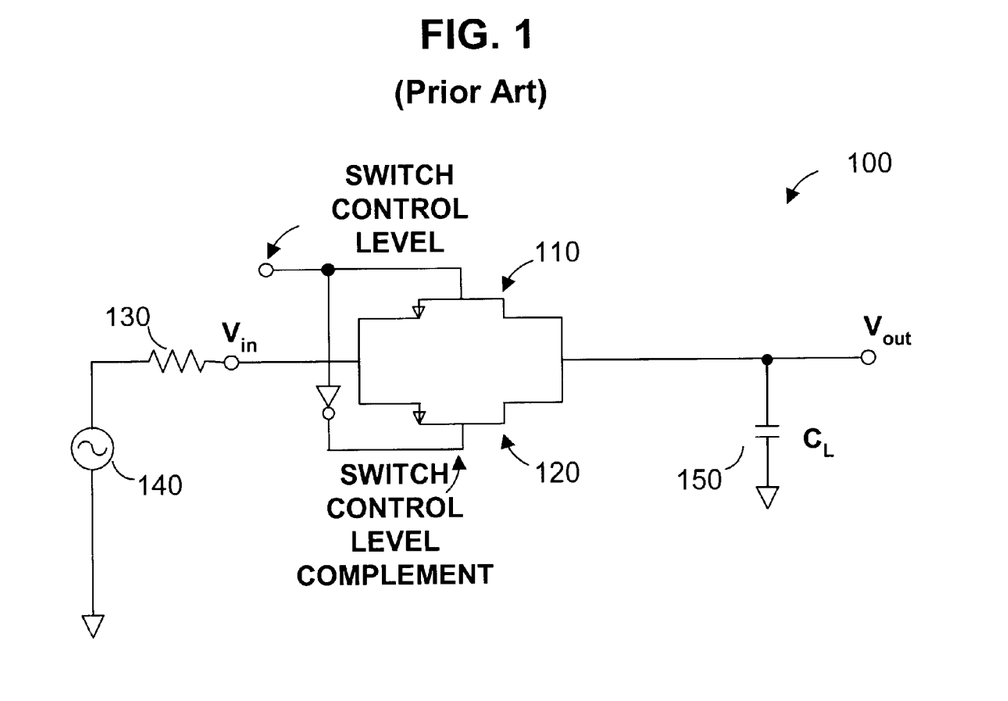
FIG. 1 is a conventional CMOS analog switch.

FIG. 1 shows a conventional CMOS switch 100. Switch 100 includes N-channel device 110, P-channel device 120, a switch control level and compliment of the switch control level which may be implemented using a controllable 3-volt supply, an equivalent source resistance 130, an analog input signal 140, and a load capacitance 150. N-channel device 110 may be at a 1:4 ratio with the P-channel device 120. When switch 100 is provided with the 3-volt supply voltage, it allows the Vin to be passed to Vout. However, the Vin signal experiences some distortion at the switching thresholds of N-channel device 110 and P-channel device 120.

Figure 2:
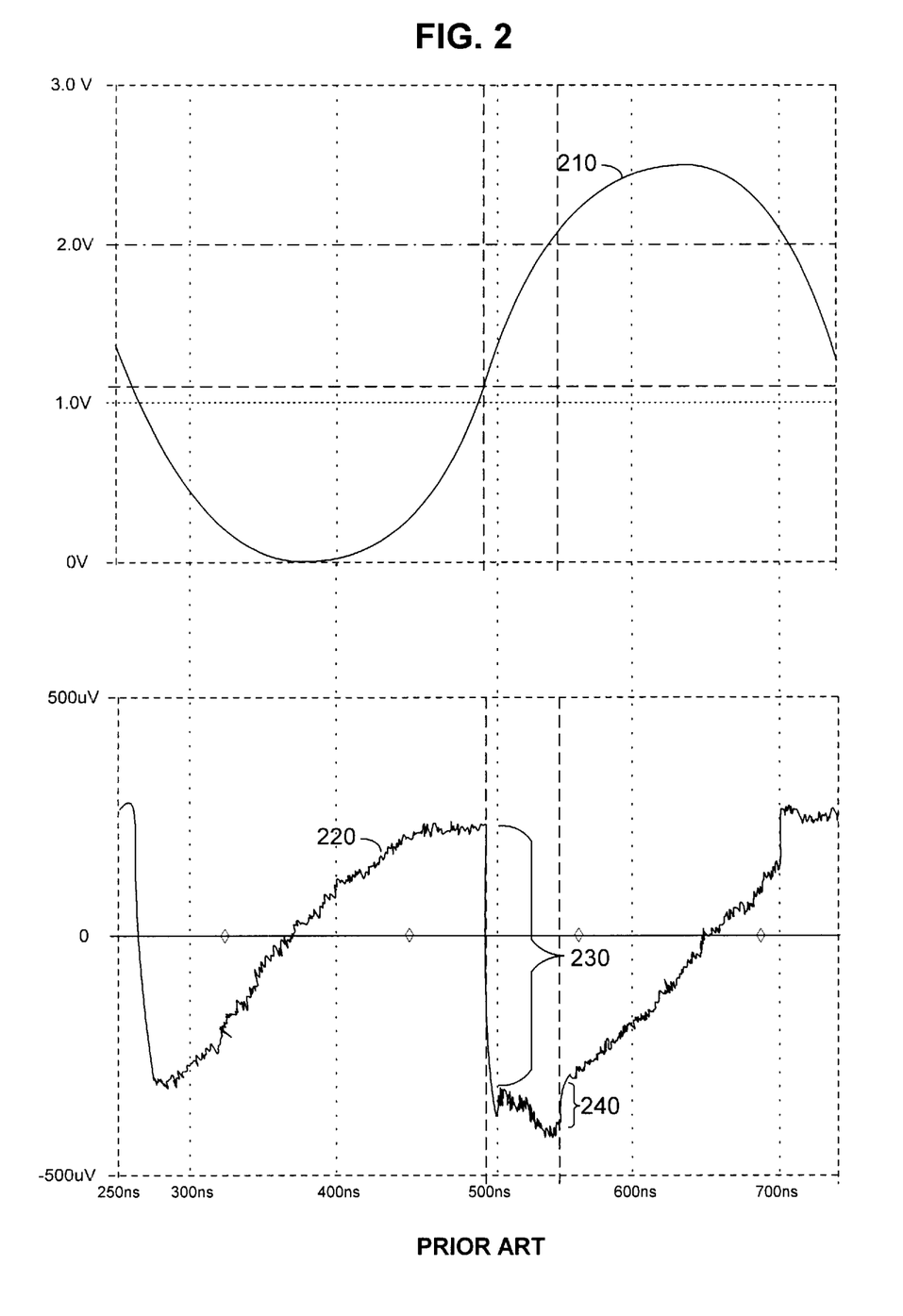
FIG. 2 is a diagram of the distortion which results from gate capacitance currents in a conventional CMOS analog switch.

The distortion of the switch 100 at the switching thresholds is shown in FIG. 2. FIG. 2 shows a diagram 210 of Vin and a diagram 220 of distortion from Vin to Vout. This distortion is caused in large part by the charging and discharging of the internal capacitances of N-channel device 110 and P-channel device 120. In this example, Vin 210 varies between 0 volts and 2.5 volts. Distortion from Vin to Vout, which is shown in the trace in the second diagram 220, varies between +0.35 millivolts and −0.35 millivolts.

Diagram 220 also directly shows the error attributable to the P-channel gate capacitance current and the N-channel gate capacitance current. The sharp drop in region 230 is caused by error from the P-channel capacitance and the sharp increase in region 240 is caused by error from the N-channel capacitance. (The diagrams represent the values of Vin and Distortion from Vin to Vout over the same time period. Thus, it can be seen that, in this particular circuit, the switching threshold for the P-channel device 120 in switch 100 is at about 1.1 volts and the switching threshold for the N-channel device is about 2 volts.)

Figure 3:
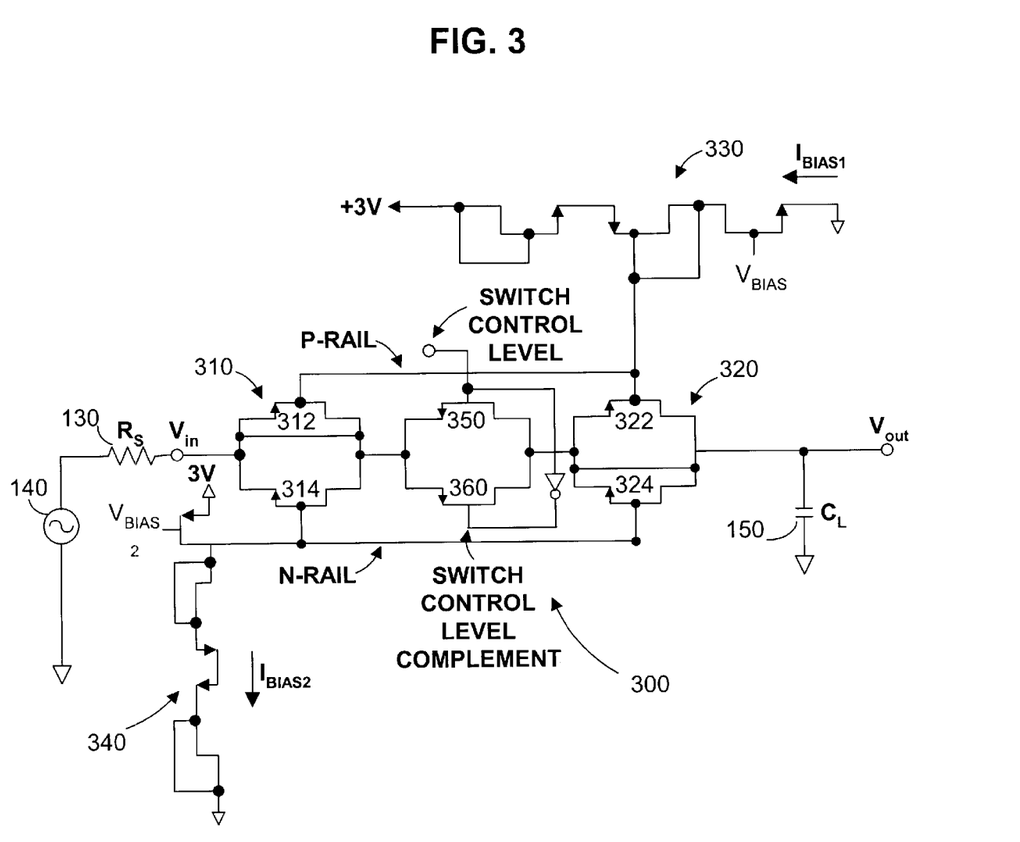
FIG. 3 is a CMOS analog switch according to the invention.

FIG. 3 shows one embodiment of a compensated CMOS switch 300 according to the principles of the invention. CMOS switch 300, including N-channel device 350 and P-channel device 360, is compensated by drain-source connected switches 310, including P-channel device 312 and N-channel device 314, and 320, including P-channel device 322 and N-channel device 324. It should be noted that switches 310 and 320 are preferably configured to have opposite channel polarity from the polarity of switch 300.

FIG. 3 also shows biasing circuitry 330 and 340 which provide the N-RAIL potential and the P-RAIL potential, in order to bias the two drain-source connected switches 310 and 320. Bias current is also provided and indicated by $I_{BIAS1}$ and $I_{BIAS2}$. This current sets the requirements of the thresholds of the smaller devices 310 and 320 such that the turn-ON and turn-OFF thresholds of these devices match the respective thresholds of the larger devices in switch 300 that the smaller devices are compensating.

The N-channel device 350 of CMOS switch 300 is preferably in a 1:4 ratio with the P-channel device 360. Similarly, P-channel devices 312 and 322 may be in a 1:4 ratio with the N-channel devices 314 and 324. It should be noted that the invention is not limited to these specific ratios, but, rather the ratios illustrate only one embodiment of the invention.

The circuit shown in FIG. 3 operates as follows. When the 3-volt supply voltage is applied to the N-channel device 350, CMOS switch preferably allows Vin to be transmitted to Vout. Vin may be conducted by N-channel device 350, P-channel device 360 or by both devices simultaneously. While the ON resistance of CMOS switch 300 affects the transmission of Vin, the ON resistances of switches 310 and 320 do not affect the transmission of the signal from Vin to Vout because they are short-circuited across their drain/source.

When the level of Vin reaches the switching threshold of either N-channel 350 or P-channel 360 the gate capacitance currents in switches 310 and 320 counterbalance the gate capacitance currents in switch 300 at the switching thresholds. For example, when N-channel device 350 turns ON, P-channel devices 312 and 322 turn OFF to provide counterbalancing gate capacitance currents. This counterbalancing substantially reduces the distortion caused by the non-linear gate capacitance current at the switching threshold of N-channel device 350 in switch 300. This occurs because gate-channel capacitance currents exist at the switching thresholds of P-channel devices 312 and 322 and N-channel devices 314 and 324 though the drain-source connections in switches 310 and 320 are shorted out.

Figure 4:
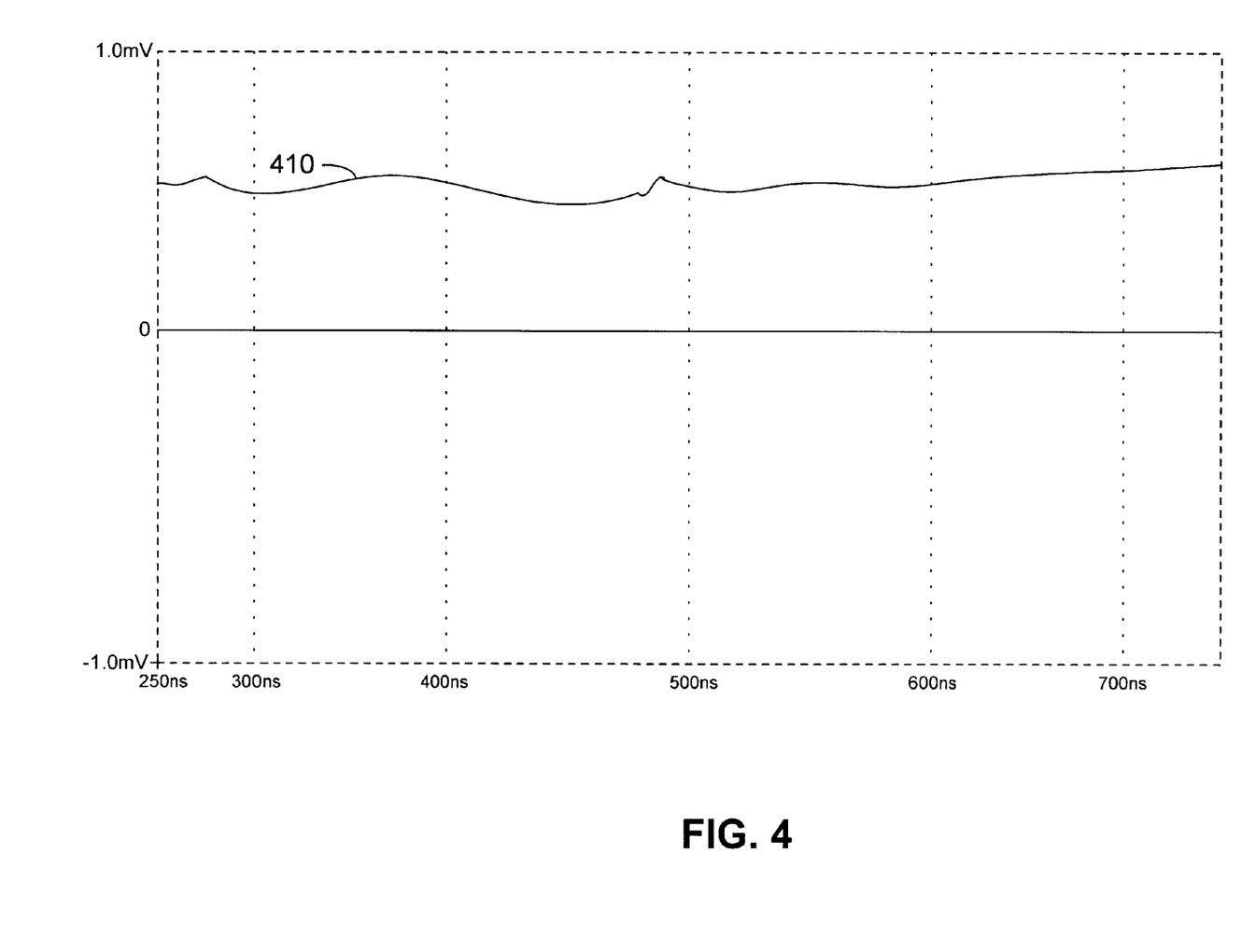
FIG. 4 is a diagram of the distortion which results from gate capacitance currents in a CMOS analog switch according to the invention.

FIG. 4 shows a diagram 410 of the distortion from Vin to Vout response obtained from a circuit according to the invention. This diagram 410 varies between approximately 0.45 millivolts and 0.55 millivolts. This variation of 0.1 millivolts in the distortion from Vin to Vout is substantially less than the variation of a conventional CMOS switch, which is 0.7 millivolts, as shown above in FIG. 2. This result was obtained from a circuit similar to the circuit shown in FIG. 3. The one difference between the circuit shown in FIG. 3 and the circuit used to provide the trace shown in FIG. 4 is in the biasing circuitry used to provide P-RAIL and N-RAIL.

Figure 5:
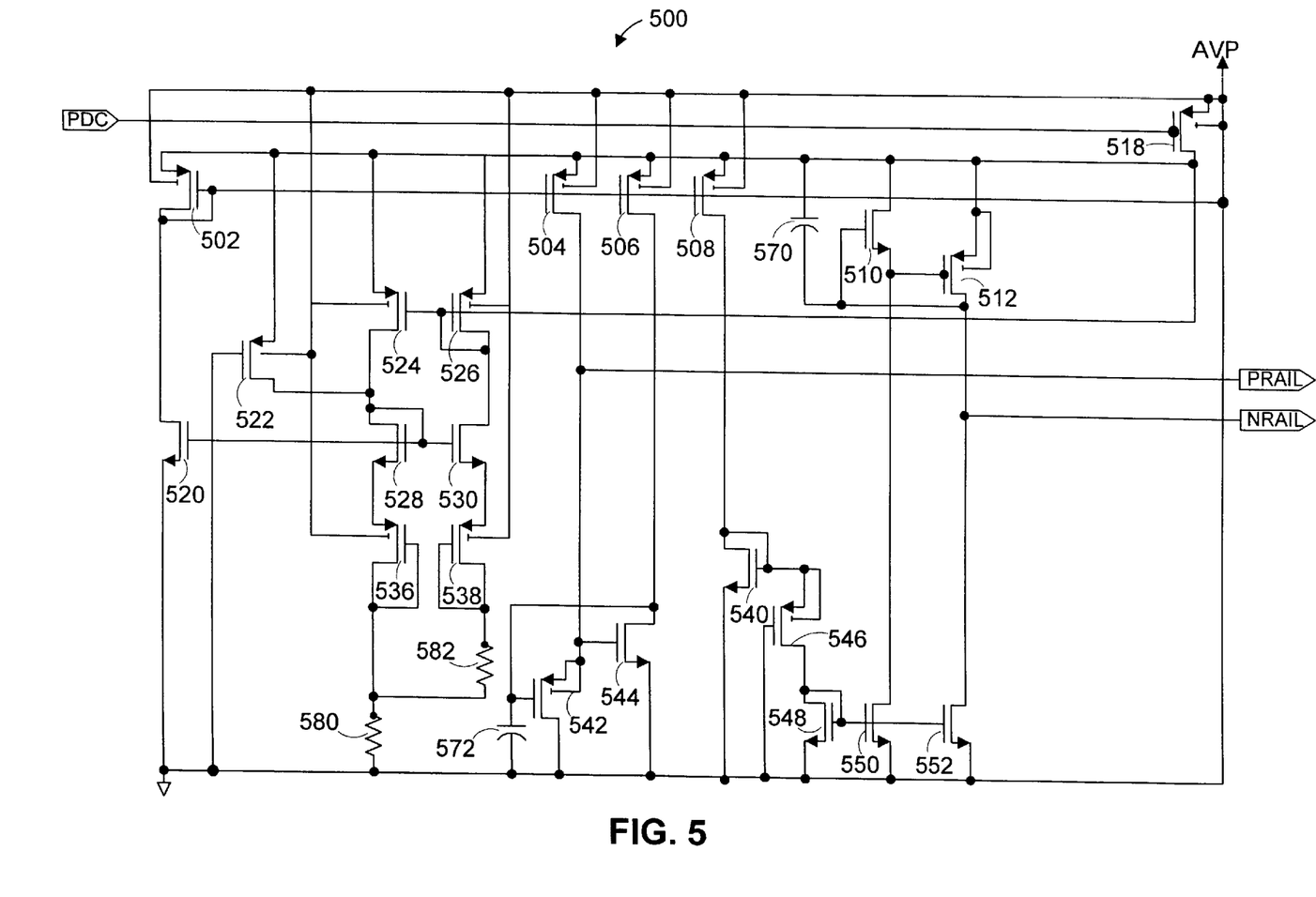
FIG. 5 is an embodiment of a biasing circuit that biases a portion of a CMOS analog switch according to the invention.

FIG. 5 shows the embodiment of the biasing circuitry 500 used to provide P-RAIL and N-RAIL in a circuit according to the invention that produced diagram 410 in FIG. 4. Biasing circuitry 500 was used for a circuit similar to the circuit shown in FIG. 3 in order to obtain the diagram shown in FIG. 4. Biasing circuitry 500 includes transistors 502, 504, 506, 508, 510, 512, 518, 520, 522, 524, 526, 528, 530, 536, 538, 540, 542, 544, 546, 548, 550, 552; resistors 580 and 582; and capacitors 570 and 572.

In a preferred embodiment of the invention, biasing circuitry 500 provides bias voltages that substantially track the sum of thresholds of switch 300 with switches 310 and 320, independent of process variations in the formation of the circuit and temperature variations in the operation of the circuit over a generally accepted operating range. Transistors 524, 526, 528, 530, 536, 538, together with resistors 580 and 582, preferably form the temperature tracking portion of the bias circuitry.

Figure 6:
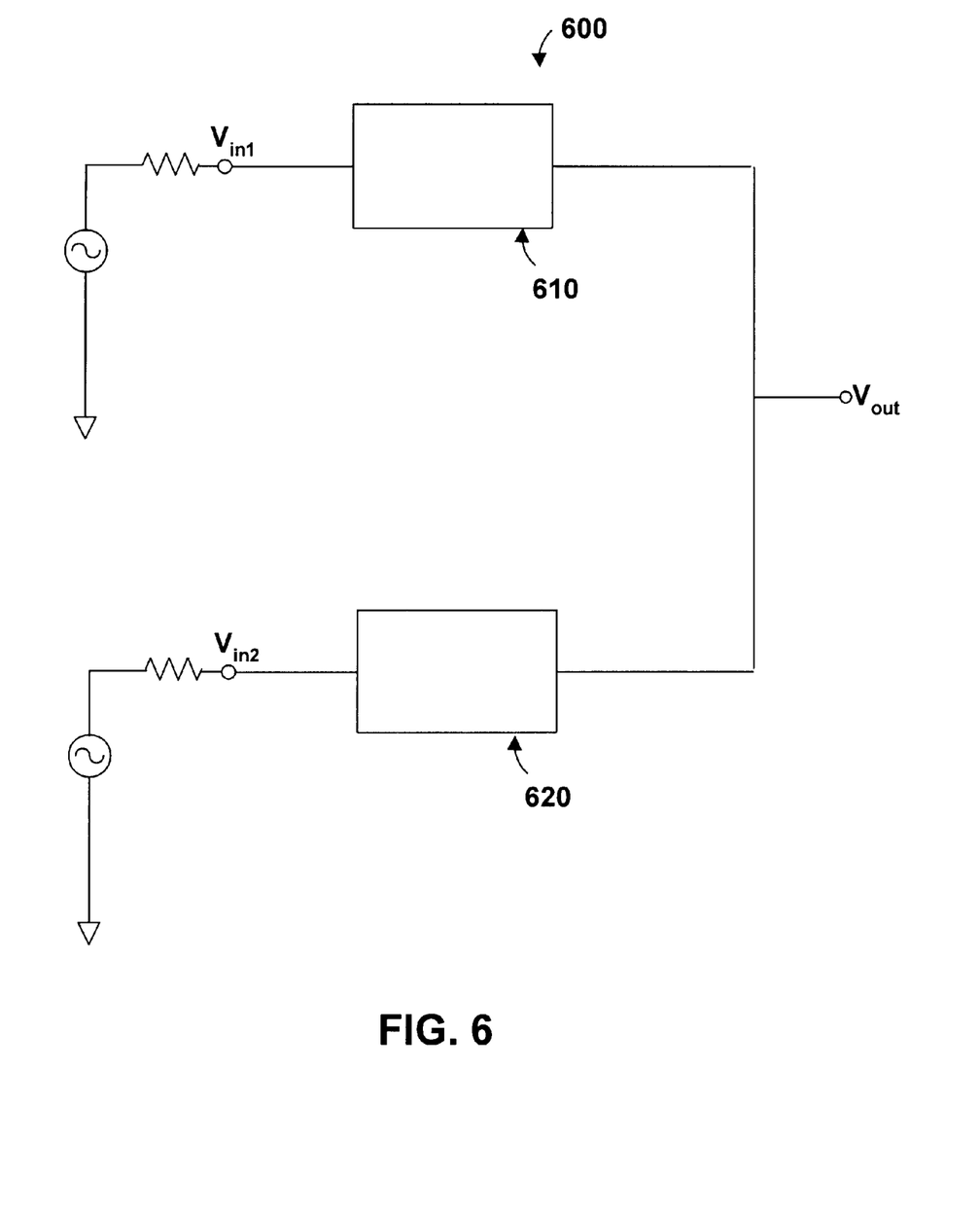
FIG. 6 is an embodiment of a circuit according to the invention which implements a multiplexed switch architecture.

FIG. 6 is an embodiment of a circuit 600 according to the invention which implements a multiplexed switch architecture. Switches 610 and 620 may be controlled at the switch control levels such that inputs, $V_{in1}$ and $V_{in2}$, into the switches may be multiplexed into a single output. In this embodiment, the multiplexed output includes a substantially reduced non-linear gate capacitance component. It should be noted that the compensation circuit according to the invention can be implemented in any number of switches in the multiplexer circuit.

Thus it is seen that the a CMOS switch with linearized gate capacitance has been provided. One skilled in the art will appreciate that the present invention can be practiced by other than the described embodiments, which are presented for purposes of illustration rather than of limitation, and the present invention is limited only by the claims which follow.

What is claimed is:

1. A compensation circuit for a CMOS switch, the compensation circuit comprising:

a nonlinear gate capacitance compensation circuit coupled to the CMOS switch; and biasing circuitry for providing a substantially fixed bias voltage that is coupled to the nonlinear gate capacitance compensation circuit, the biasing circuitry that provides the substantially fixed bias voltage to the nonlinear gate capacitance compensation circuit when the CMOS switch is in an ON state.

2. The compensation circuit of claim 1 further comprising an input voltage (Vin) and a voltage output (Vout), wherein the nonlinear gate capacitance compensation circuit comprises a first drain-source connected switch coupled between Vin and the CMOS switch and a second drain-source connected switch coupled between Vout and the CMOS switch on either side of the CMOS switch.

3. The compensation circuit of claim 2 wherein the first drain-source connected switch comprises a channel width that is about half the size of the channel width of the CMOS switch.

4. The compensation circuit of claim 2 wherein the first drain-source connected switch is a drain-source connected CMOS switch configured at a reverse polarity to the CMOS switch.

5. The compensation circuit of claim 2 wherein the second drain-source connected switch comprises a channel width that is about half the size of the channel width of the CMOS switch.

6. The compensation circuit of claim 2 wherein the second drain-source connected switch is a drain-source connected CMOS switch configured at a reverse polarity to the CMOS switch.

7. The compensation circuit of claim 1 further comprising an input voltage (Vin) and a voltage output (Vout), wherein the nonlinear gate capacitance compensation circuit comprises a drain-source connected switch coupled between Vin and the CMOS switch on a first side of the CMOS switch.

8. The compensation circuit of claim 2 wherein an N-channel portion of the first drain-source connected switch and an N-channel portion of the second drain-source connected switch are configured to turn ON substantially simultaneously to a turn-OFF of a P-channel portion of the CMOS switch.

9. The compensation circuit of claim 2 wherein a P-channel portion of the first drain-source connected switch and a P-channel portion of the second drain-source connected switch are configured to turn ON substantially simultaneously to a turn-OFF of an N-channel portion of the CMOS switch.

10. The compensation circuit of claim 1 further comprising an input voltage (Vin) and a voltage output (Vout), wherein the nonlinear gate capacitance compensation circuit comprises a drain-source connected switch coupled between Vout and the CMOS switch on one side of the CMOS switch.

11. The compensation circuit of claim 2 wherein the biasing circuitry provides the bias voltage to the first drain-source connected switch and the second drain-source connected switch to substantially cancel variations in a process of forming the CMOS switch and a temperature of operation of the CMOS switch.

12. A method of using a gate capacitance compensation circuit for maintaining a substantially constant gate capacitance of a CMOS switch, the gate capacitance compensation circuit being biased with a fixed bias voltage, the CMOS switch having an N-channel device and a P-channel device, and the CMOS switch receiving an input voltage, the method comprising:

compensating a non-linear gate capacitance current in the N-channel device at a first threshold level of the input voltage; and compensating a non-linear gate capacitance current in the P-channel device at a second threshold level of the input voltage.

13. The method of claim 12, the compensating in the N-channel device comprising providing two opposite channel polarity P-channel capacitance currents.

14. The method of claim 13, wherein the providing two opposite channel polarity P-channel capacitance currents further comprises providing each of the opposite channel polarity P-channel capacitance currents having half the value of the non-linear gate capacitance current in the N-channel device at the first threshold.

15. The method of claim 13, wherein the two opposite channel polarity P-channel capacitance currents are substantially independent of process variations and operating temperature.

16. The method of claim 12, the compensating in the P-channel device comprising providing two opposite channel polarity N-channel capacitance currents.

17. The method of claim 16, wherein the providing two opposite channel polarity N-channel capacitance currents further comprises providing each of the opposite channel polarity N-channel capacitance currents having half the value of the non-linear gate capacitance current in the P-channel device at the second threshold.

18. The method of claim 16, wherein the two opposite channel polarity N-channel capacitance currents are substantially independent of process variations and operating temperature.

19. A method of using a gate capacitance compensation circuit for maintaining a gate capacitance of a CMOS switch substantially constant, the gate capacitance compensation circuit being biased with a fixed bias voltage, a first drain-source connected switch being coupled between an input voltage and the CMOS switch and a second drain-source connected switch being coupled between the CMOS switch and a voltage output, the method comprising:

turning on an N-channel portion of the first drain-source connected switch and an N-channel portion of the second drain-source connected switch substantially simultaneously to turning OFF a P-channel portion of the CMOS switch; and turning on a P-channel portion of the first drain-source connected switch and a P-channel portion of the second drain-source connected switch substantially simultaneously to turning OFF an N-channel portion of the CMOS switch.

20. A method of using a gate capacitance compensation circuit for maintaining a gate capacitance of a CMOS switch substantially constant, the gate capacitance compensation circuit being biased with a fixed bias voltage, a first drain-source connected switch being coupled between an input voltage and the CMOS switch and a second drain-source connected switch being coupled between the CMOS switch and a voltage output, the method comprising:

turning ON an N-channel portion of the first drain-source connected switch and an N-channel portion of the second drain-source connected switch, and turning OFF a P-channel portion of the CMOS switch at a first level of the input voltage to the CMOS switch; and turning ON a P-channel portion of the first drain-source connected switch and a P-channel portion of the second drain-source connected switch, and turning OFF an N-channel portion of the CMOS switch at a second level of the input voltage.

21. A multiplexer circuit comprising:

a plurality of CMOS switches;

a nonlinear gate capacitance compensation circuit for compensating non-linear gate capacitance current in at least one of the plurality of CMOS switches; and wherein the gate capacitance compensation circuit is biased with a fixed bias voltage.

* * * * *